United States Patent
Mak et al.

(10) Patent No.: US 9,646,758 B2
(45) Date of Patent: May 9, 2017

(54) METHOD OF FABRICATING INTEGRATED CIRCUIT (IC) DEVICES

(71) Applicant: GLOBALFOUNDRIES Inc., Grand Cayman (KY)

(72) Inventors: Tak Ming Mak, Union City, CA (US); Ajit M. Dubey, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/798,604

(22) Filed: Jul. 14, 2015

(65) Prior Publication Data
US 2017/0018348 A1 Jan. 19, 2017

(51) Int. Cl.
*H05K 3/20* (2006.01)
*H01F 27/28* (2006.01)
(Continued)

(52) U.S. Cl.
CPC ......... *H01F 27/2804* (2013.01); *H01F 27/29* (2013.01); *H01F 41/041* (2013.01); *H01F 2027/2809* (2013.01)

(58) Field of Classification Search
CPC .... H01F 5/04; H01F 27/2804; H01F 27/2871; H01F 27/29; H01F 41/041; Y10T 29/49007; Y10T 29/49071; Y10T 29/49073; Y10T 29/49075; Y10T 29/49078
USPC ...... 29/602.1, 605, 606, 608, 832, 841, 848, 29/856, 858, 883; 336/83, 175, 192, 200, 336/212, 233
See application file for complete search history.

(56) References Cited

U.S. PATENT DOCUMENTS 6,927,490 B2 * 8/2005 Franzon .................. H01L 23/13
  257/734
7,583,165 B2 * 9/2009 Green ..................... H01P 7/005
  333/202

(Continued)

OTHER PUBLICATIONS

Wibben et al., "A High Efficiency DC-DC Converter Using 2nH On-Chip Inductors", Symposium on VLSI Circuits Digest of Technical Papers, Jun. 2007, retrieved on Aug. 24, 2015 from http://ieeexplore.ieee.org/xpl/login.jsp?tp=&arnumber=4342750 &url=http%3A%2F%2Fieeexplore.ieee.org%2Fxpls%2Fabs_all.jsp%3Farnumber%3D4342750, 2 Pages.

*Primary Examiner* — Paul D Kim
(74) *Attorney, Agent, or Firm* — Ditthavong & Steiner, P.C.

(57) ABSTRACT

Methods of coupling inductors in an IC device using interconnecting elements with solder caps and the resulting device are disclosed. Embodiments include forming a top inductor structure, in a top inductor area on a lower surface of a top substrate, the top inductor structure having first and second top terminals at its opposite ends; forming a bottom inductor structure, in a bottom inductor area on an upper surface of a bottom substrate, the bottom inductor structure having first and second bottom terminals at its opposite ends; forming top interconnecting elements on the lower surface of the top substrate around the top inductor area; forming bottom interconnecting elements on the upper surface of the bottom substrate around the bottom inductor area; forming solder bumps on lower and upper surfaces, respectively, of the top and bottom interconnecting elements; and connecting the top and bottom interconnecting elements to each other.

11 Claims, 13 Drawing Sheets

(51) Int. Cl.
*H01F 41/04* (2006.01)
*H01F 27/29* (2006.01)

(56) References Cited

U.S. PATENT DOCUMENTS 8,362,481 B2 * 1/2013 Sellathamby ........... H01L 23/48
257/48
2014/0240072 A1 * 8/2014 Lan ..................... H01F 27/2804
336/200

* cited by examiner

Background

Background

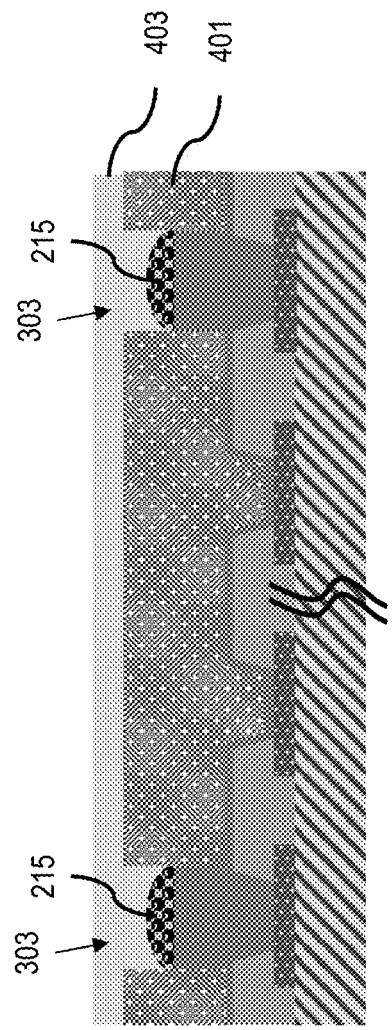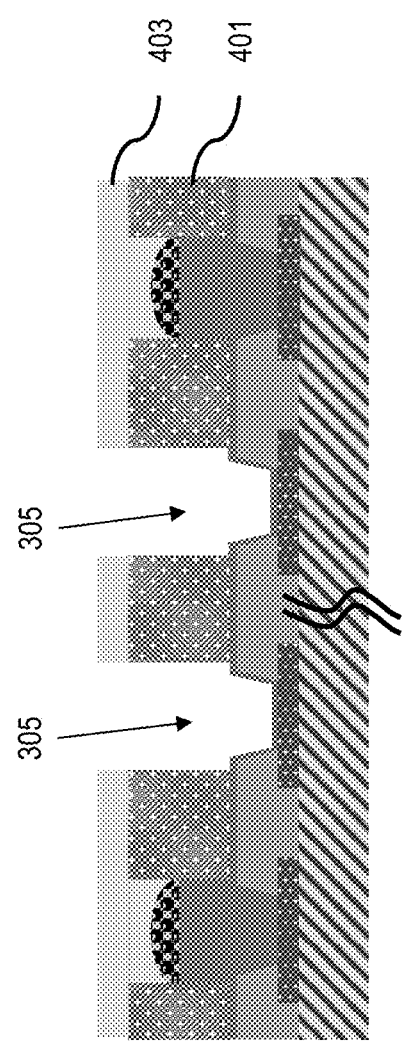
FIG. 4E
FIG. 4F

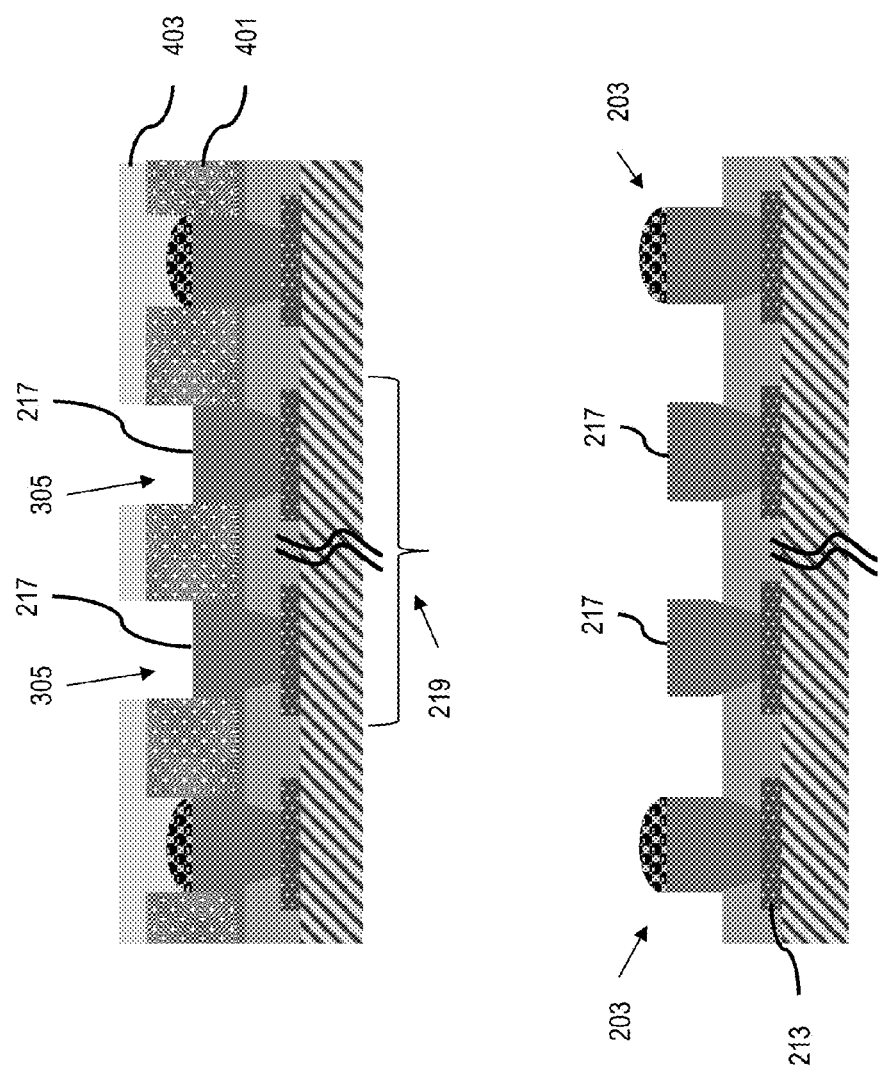

METHOD OF FABRICATING INTEGRATED CIRCUIT (IC) DEVICES

TECHNICAL FIELD

The present disclosure relates generally to designing and fabricating integrated circuit (IC) devices. The present disclosure is particularly applicable to integrating coupled inductors in an IC device.

BACKGROUND

Generally, an IC device may include a variety of components such as transistors, capacitors, inductors, voltage regulators, resistors, or the like, which may provide various functionalities in operation of an IC device. With industry demand for more efficient, smaller sized, and multifunctioning IC devices, manufacturing of such devices requires advanced IC design and manufacturing processes. Two coupled inductors have been used for ripple cancelation in integrated voltage regulators (IVRs). With a special timing scheme, the two phases perform complete current ripple cancellation across all duty cycles in the output. Moreover, the ripple current through each inductor is substantially reduced by a factor of (1+k) which decreases the inductor loss and improves the power supply efficiency. This converter topology enables the use of ultra-small inductors (2 nH) in a high efficiency converter and an ultra-small capacitor (2 nF) in an ultra-compact size. Components, such as an inductor without a core, may be challenging to implement in an IC device, wherein a thicker (e.g., 2 μm) metal layer may be required for forming the inductor coil/spiral. Coupled inductors may be implemented in a single metal layer (e.g., side-by-side) or in multiple adjacent (e.g., stacked) metal layers; however, in either case, the implementation would require a layout area in one or more layers, which may already include congested and compacted layouts of other components.

FIG. 1A schematically illustrates an example of coupled inductors implemented on a same layer in an IC device. Substrate layer 101 includes a coupled inductor coils/spirals 103 and 105 that are implemented on the same layer. As mentioned, such an implementation may require large and sufficient layout area to form the multiple turns in the coils 103 and 105 for sufficient inductance (e.g. 1 to 10 μH) and performance. Also, a coupling coefficient between the two inductors may be low since only a portion of the magnetic flux from one inductor can be picked up by the other. Additionally, thickness limitations of metal layers in the IC device may adversely impact functionality (e.g., current carrying capacity) of the inductors in a component (e.g., a voltage regulator) employing them.

Similar issues are associated with another example of coupled inductors as illustrated in FIG. 1B, where inductor coils 107 and 109 are implemented on two different layers 101a and 101b, respectively. This implementation still requires precious die area in the IC device and lots of turns of the coils for sufficient inductance. Additionally, the coils would need to be formed in two adjacent metal layers that have the same thickness; however, some of the metal layers (e.g., top and lower) may have different thicknesses (for example the top metal layer is typically much thicker), which can impact functionality and performance quality of the inductors as well as the component(s) utilizing such inductors. In other IC design and fabrication methods, inductors may be implemented by creating deep trenches (e.g. 100 μm deep) in a silicon interposer for the coils and filling with copper, but more complex fabrication processes would be necessary. Further, although the inductor area may be small (e.g., 0.8×0.4 mm$^2$), and spacing between inductors is not critical, there is an additional silicon wafer cost.

Therefore, there is a need for a methodology enabling formation of coupled inductors in an IC device with a reduced area without metal and silicon thickness issues and resulting devices.

SUMMARY

An aspect of the present disclosure is a method of using interconnecting elements (e.g., copper pillars) with solder caps on substrates to implement coupled inductors in an IC device.

Another aspect of the present disclosure is an IC device including interconnecting elements with solder caps on substrates to implement coupled inductors.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a top inductor structure, in a top inductor area on a lower surface of a top substrate, the top inductor structure having first and second top terminals at its opposite ends; forming a bottom inductor structure, in a bottom inductor area on an upper surface of a bottom substrate, the bottom inductor structure having first and second bottom terminals at its opposite ends; forming top interconnecting elements on the lower surface of the top substrate around the top inductor area; forming bottom interconnecting elements on the upper surface of the bottom substrate around the bottom inductor area; forming solder bumps on lower and upper surfaces, respectively, of the top and bottom interconnecting elements; and connecting the top and bottom interconnecting elements to each other. In some aspects, forming each of the top and bottom inductor structures includes forming a coil of conductive material, the coil having first and second terminals at its opposite ends.

Another aspect includes forming the top interconnecting elements concurrently with the top inductor structure and the bottom interconnecting elements concurrently with the bottom inductor structure; forming a mask over each of the top and bottom inductor structures; forming the solder bumps; and removing the mask prior to connecting the top and bottom interconnecting elements.

One aspect includes forming the top interconnecting elements, the bottom interconnecting elements, and solder bumps and forming a mask over the solder bumps prior to forming the top and bottom inductor structures; and removing the mask subsequent to forming the top and bottom inductor structures.

An additional aspect includes forming a top barrier structure, in the top inductor area at the lower surface, spaced from and surrounding a perimeter of the top inductor structure; forming a bottom barrier structure, in the bottom inductor area at the upper surface, spaced from and surrounding a perimeter of the bottom inductor structure; depositing a layer of non-conductive bonding material, with a same thickness as the solder bumps, on lower and upper surfaces, respectively, of the top and bottom barrier structures; and connecting the top and bottom barrier structures.

In one aspect, the top and bottom inductor structures are separated from each other by an air gap.

In another aspect, the top inductor structures, the top inductor areas, and top barrier structures are substantially a same geometrical shape as and are vertically aligned with the bottom inductor structures, bottom inductor areas, and bottom barrier structures, respectively. Some aspects include injecting an under-fill material around the top and bottom barrier structures subsequent to connecting the top and bottom barrier structures. In one aspect, the top and bottom inductor structures are at a same height as the top and bottom interconnecting elements.

According to the present disclosure, some technical effects may be achieved in part by a semiconductor device including: a top substrate having a lower surface; a bottom substrate having an upper surface; a top inductor structure, in a top inductor area at the lower surface, the top inductor structure having first and second top terminals at its opposite ends; a bottom inductor structure, in a bottom inductor area at the upper surface, the bottom inductor structure having first and second bottom terminals at its opposite ends; top interconnecting elements on the lower surface surrounding the top inductor area; bottom interconnecting elements on the upper surface surrounding the bottom inductor area; solder bumps on lower and upper surfaces, respectively, of the top and bottom interconnecting elements; and the top and bottom interconnecting elements connected to each other. In some aspects of the semiconductor device, each of the top and bottom inductor structures includes a coil of conductive material, the coil having first and second terminals at its opposite ends.

In another aspect, the semiconductor device includes a top barrier structure, in the top inductor area at the lower surface, spaced from and surrounding a perimeter of the top inductor structure; a bottom barrier structure, in the bottom inductor area at the upper surface, spaced from and surrounding a perimeter of the bottom inductor structure; a layer of non-conductive bonding material, with a same thickness as the solder bumps, on lower and upper surfaces, respectively, of the top and bottom barrier structures; and the top and bottom barrier structures connected to each other. In an additional aspect of the semiconductor device, the top and bottom inductor structures are separated from each other by an air gap.

In one aspect of the semiconductor device, the top inductor structures, the top inductor areas, and top barrier structures are substantially a same geometrical shape as and are vertically aligned with the bottom inductor structures, bottom inductor areas, and bottom barrier structures, respectively. In some aspects, the semiconductor device includes an under-fill material around the top and bottom barrier structures. In another aspect, the top and bottom inductor structures are at a same height as the top and bottom interconnecting elements.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 4H illustrate an alternative process flow for creating interconnecting elements with solder caps as well as an inductor structure on a surface of a substrate, in accordance with another exemplary embodiment.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of a need for additional silicon layers or thick metal layer processing attendant upon creating coupled inductors in an IC device. The present disclosure addresses and solves such problems, for instance, by, inter alia, use of interconnecting elements with solder caps on opposing substrates to implement coupled inductors in an IC device.

FIGS. 2A through 2H schematically illustrate use of interconnecting elements with solder caps on substrates to implement coupled inductors in an IC device, in accordance with an exemplary embodiment.

A modern IC chip may be bonded to a package substrate by an array of copper pillars. Input-output (IO) circuits in the chip may be connected to some of the copper pillars while power circuits (buses) may be connected to other copper pillars in the array. The copper pillars on the IC chip are a mirror image of the copper pillars on the package substrate. Therefore, when the IC chip is flipped opposing the package substrate, the copper pillars may be bonded together by several techniques (e.g., solder reflow or thermal compression bonding). For example, a small amount of solder material on top of the copper pillars may be the bonding material.

In some instances, instead of patterning a copper layer in the IC chip into copper pillars, long strips may be patterned on the copper layer. Also, connected copper strips may be formed into a spiral form for use in creating an inductor. Similarly, a spiral of connected copper strips may be formed on the substrate, and once the IC chip and the substrate are bonded together, the two inductor spirals opposing each other form a coupled inductor set. Solder caps placed on top of the other copper pillars can bond the IC chip to the substrate while keeping a space between the copper inductor spirals as no solder material is placed on them. The inductor spirals/elements separated by only a small distance (e.g., a few micrometers) are closely coupled for a very high coupling coefficient.

Figure 1A:
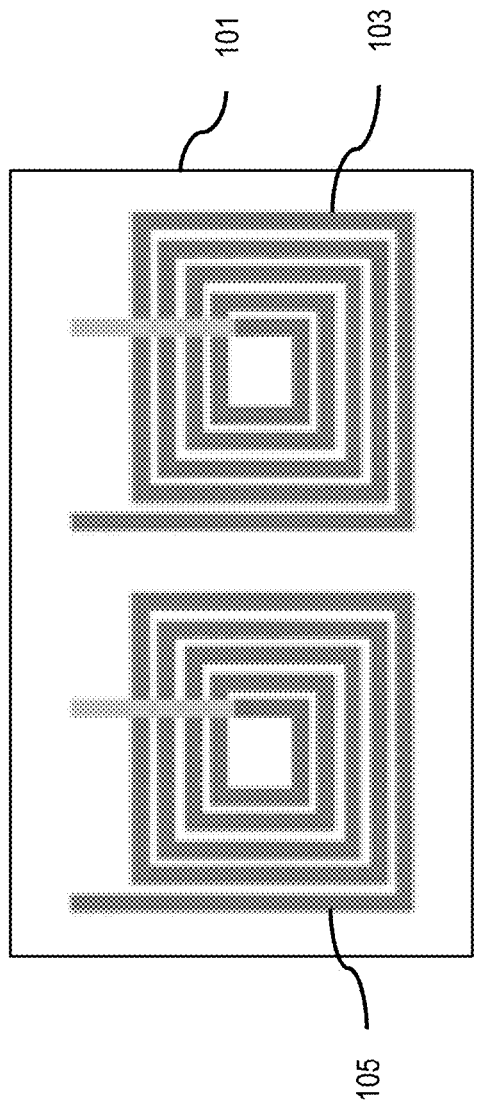
FIGS. 1A and 1B schematically illustrate examples of coupled inductors implemented in an IC device.
Figure 1B:
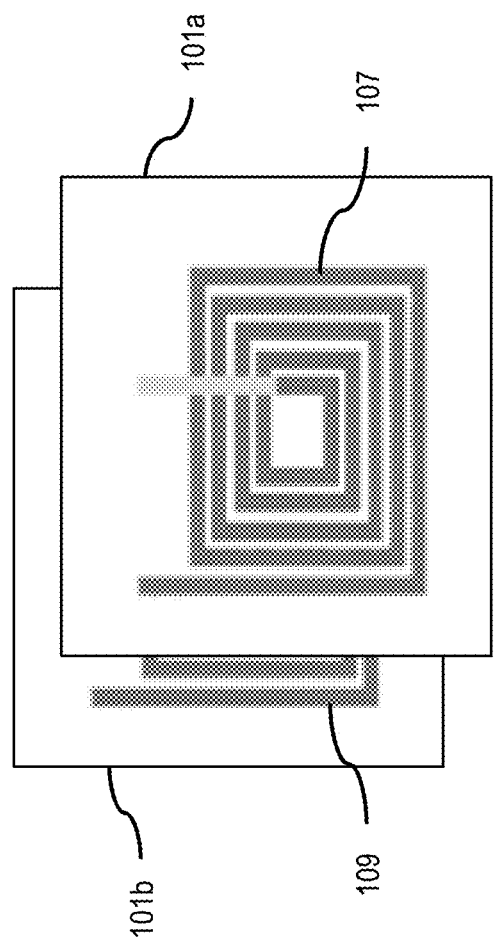
Figure 2A:
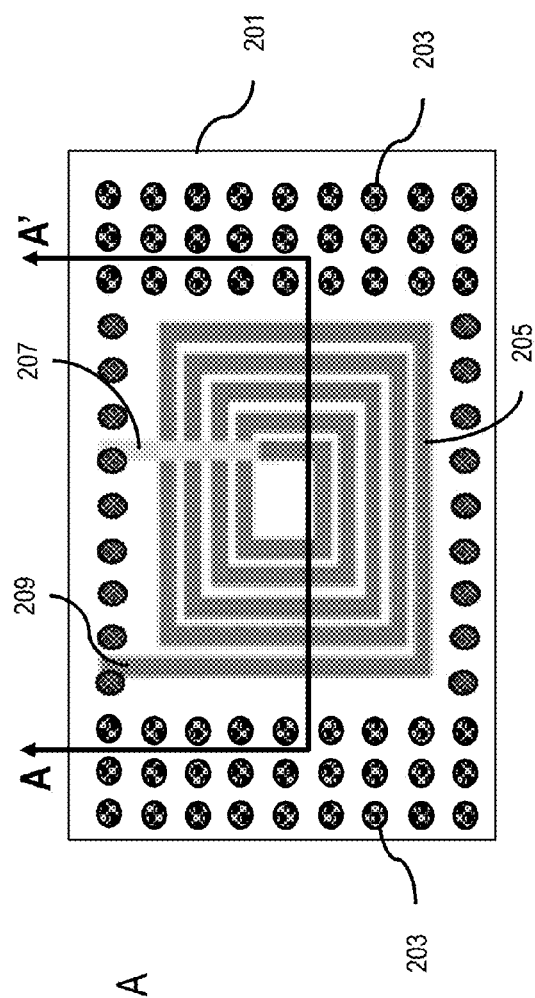
FIGS. 2A through 2H schematically illustrate use of interconnecting elements with solder caps on substrates to implement coupled inductors in an IC device, in accordance with an exemplary embodiment.
Figure 2B:
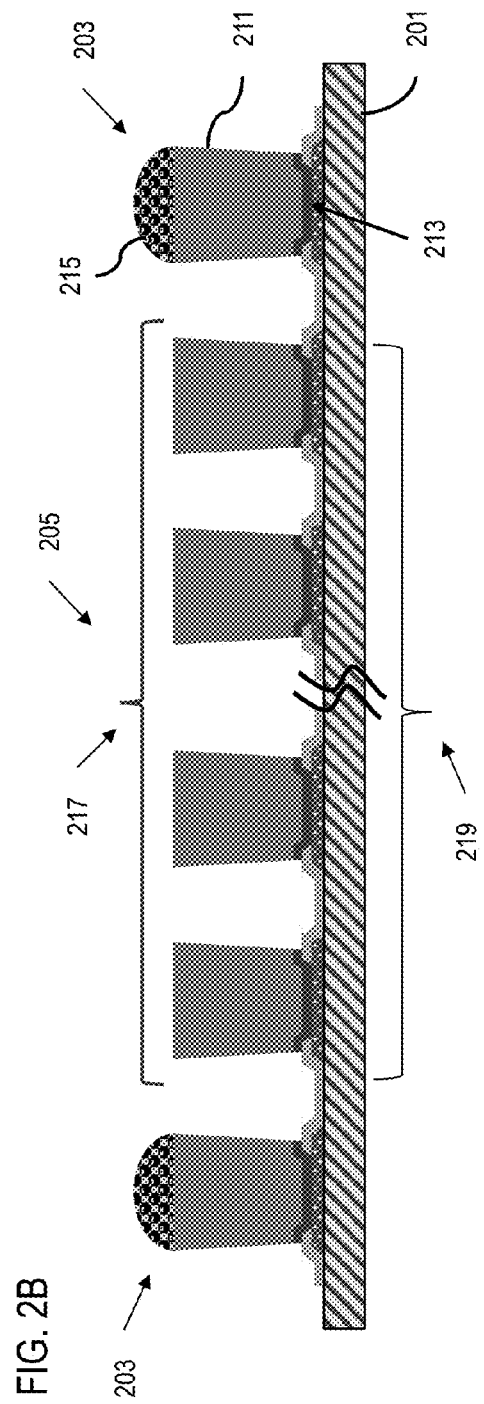

FIG. 2A illustrates an example section of a substrate layer 201 that includes interconnecting elements 203, which may be used to connect the substrate 201 to another IC substrate or to a packaging substrate. Instead of placing an IC die/chip into a final IC package, it may be used as a bare die for direct placement (e.g., flip-chip) onto a printed circuit board of an electronic device. Also, a plurality of chips may be stacked upon each other to form a 2.5-dimensional (2.5D) or 3-dimensional (3D) IC chip stack, which may then be packed into a final package. Also illustrated is an inductor structure/coil 205, including terminals 207 and 209 at opposing ends of the coil 205 that may be implemented on an upper surface of the substrate 201. An example cross sectional view A-A', as shown in FIG. 2B, may provide a better perspective, which illustrates a partial view of the cross section A-A' for clarity. As illustrated in FIG. 2B, an interconnecting element 203 includes a metal (e.g., copper (Cu)) segment/pillar 211 that is connected to a bonding/landing (e.g., Cu) pad 213, which may be connected to a respective node in an IC chip or in a packaging substrate. Further, a bonding cap 215 (e.g., a solder bump) on an upper surface of the metal segment 211 may be used to bond the metal segment 211 to a bonding pad or another metal segment 211 on another substrate, wherein the substrate 201 can be bonded to the other substrate. To create an inductor structure, the coil 205, a plurality of connected coil (e.g., Cu) line segments 217 may be created in an inductor area 219 on the upper surface of the substrate 201, where the coil line segments 217 may be connected to a metal layer (e.g., a 25 micrometer Cu layer) in the substrate 201. Also, the coil line segments 217 may be at a same height as the metal segments 211 of the interconnecting elements 203.

Figure 2C:
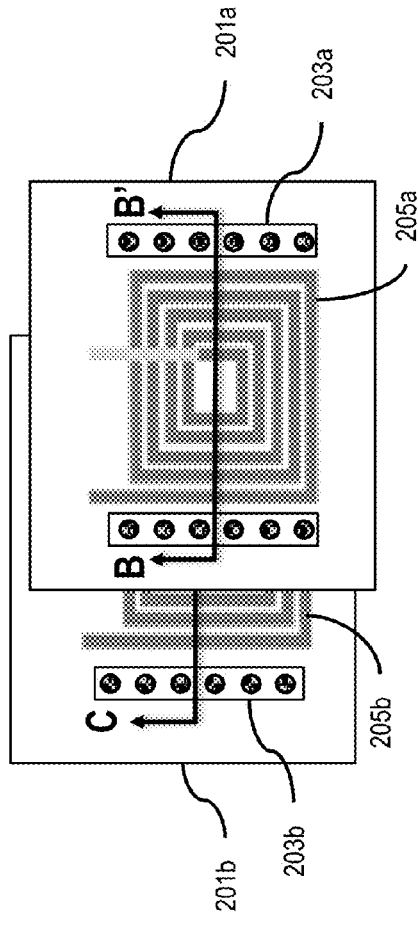
Figure 2D:
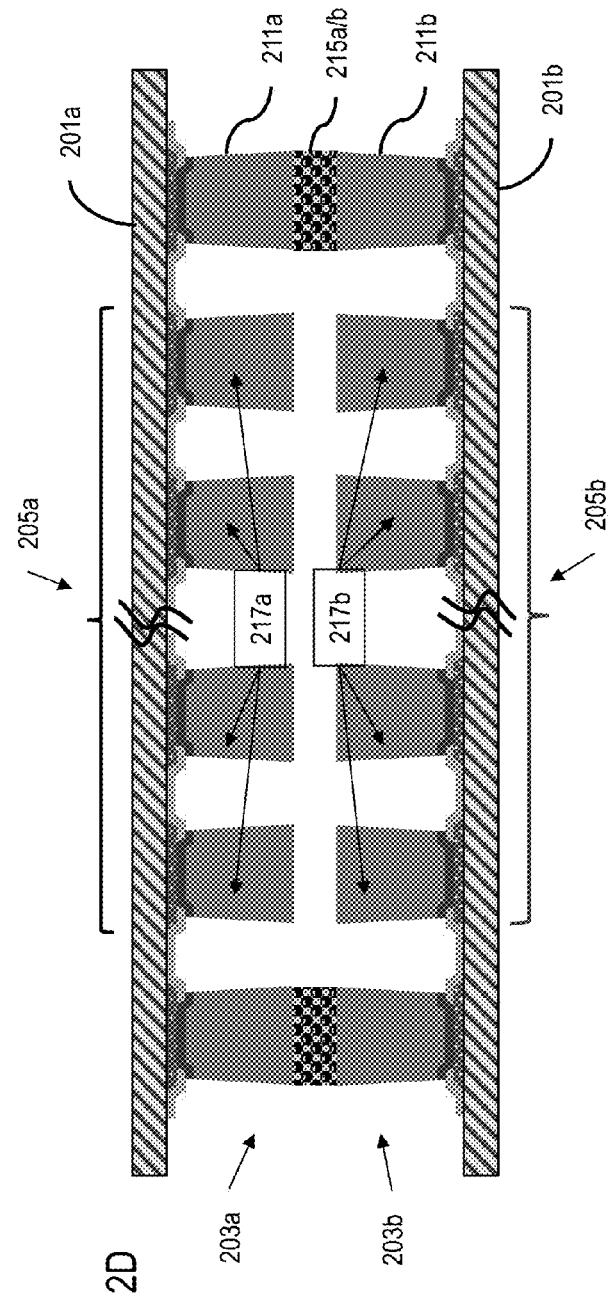

Referring to FIG. 2C now, substrates 201a and 201b include, respectively, inductors 205a and 205b that may be formed on opposing surfaces of the substrates 201a and 201b for forming a set of coupled inductors. FIG. 2D illustrates cross sectional views of B-B' and C-C' (C-C' partially being hidden under the diagram of the substrate 201a) shown in FIG. 2C. As shown in FIG. 2D, a surface of the substrate 201a opposes a surface of the substrate 201b, wherein coil line segments 217a (of coil 205a) as well as metal segments 211a (of the interconnecting elements 203a) on the surface of the substrate 201a are aligned with their respective counterparts of coil line segment 217b (of coil 205b) and metal segments 211b (of interconnecting elements 203b) on the opposing surfaces of the 201b. In such a configuration, the metal segments 211a and 211b may be capped by one or both bonding caps 215a and 215b, which can bond pairs of opposing metal segments 211 to each other (hence, bonding two substrates to each other). As illustrated, the coil line segments 217a and 217b remain separated by a space substantially equal to a thickness (e.g., 5 to 10 micrometer, after reflow) of the bonding caps 215a and 215b.

Figure 2E:
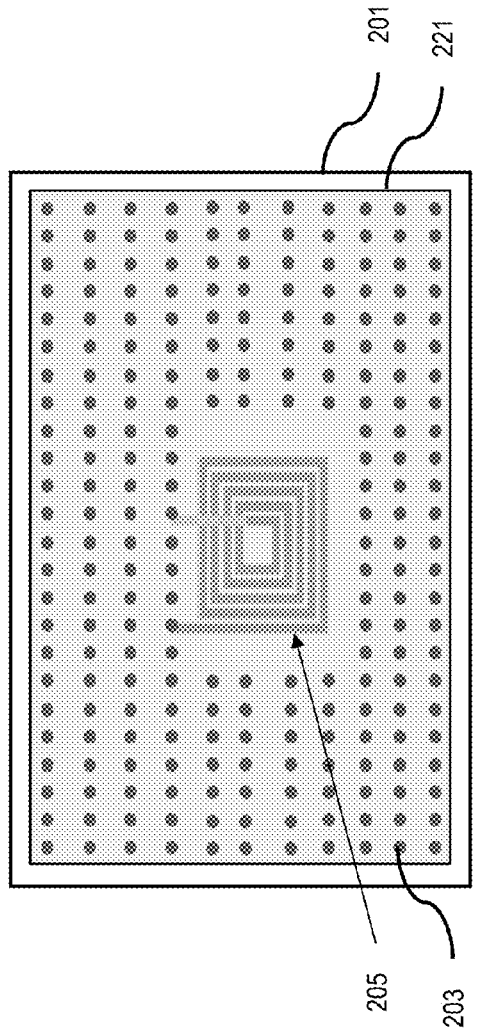
Figure 2F:
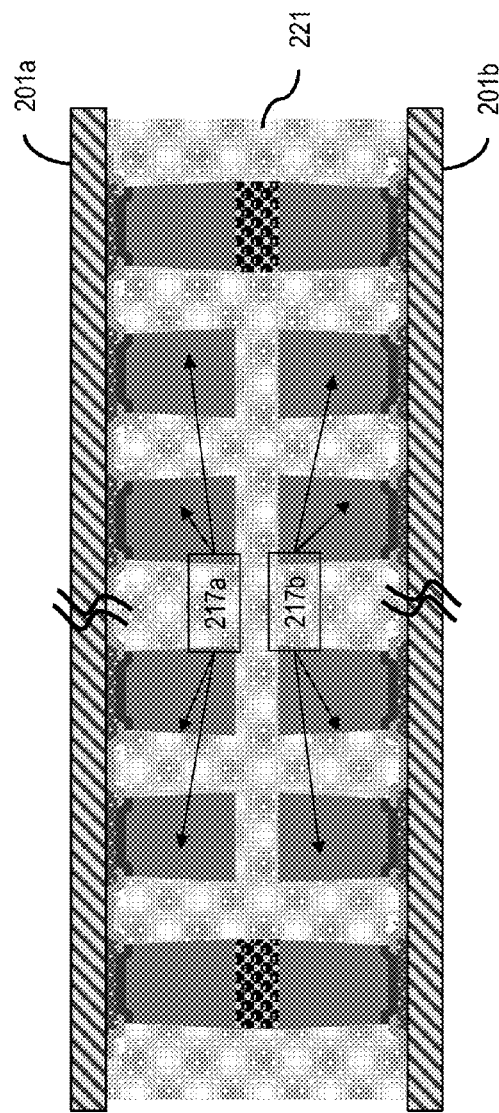

FIG. 2E illustrates a substrate 201 that includes interconnecting elements 203 and an inductor coil 205. In semiconductor manufacturing, a layer of non-conducting under-fill material 221 may be used (e.g., injected) in the space between adjacent substrates for providing additional mechanical support. The under-fill layer may fill gaps between a single chip and a substrate, the gaps between adjacent chips in a chip stack, or a chip stack and a substrate in a final package. A cross sectional view of bonded substrates 201a and 201b, as shown in FIG. 2F, illustrates an under-fill layer 221 that is filling the space between the two bonded substrates. As noted, the under-fill layer 221 is of a non-conductive material that does not affect electrical connections between the two substrates nor should it affect (e.g., non-magnetic) the functionality of the coupled inductors 205a and 205b, e.g., the coil line segments 217a and 217b. The under-fill material will simply fill the space between the IC chip and the substrate and prevent contact between the inductor elements.

Figure 2G:
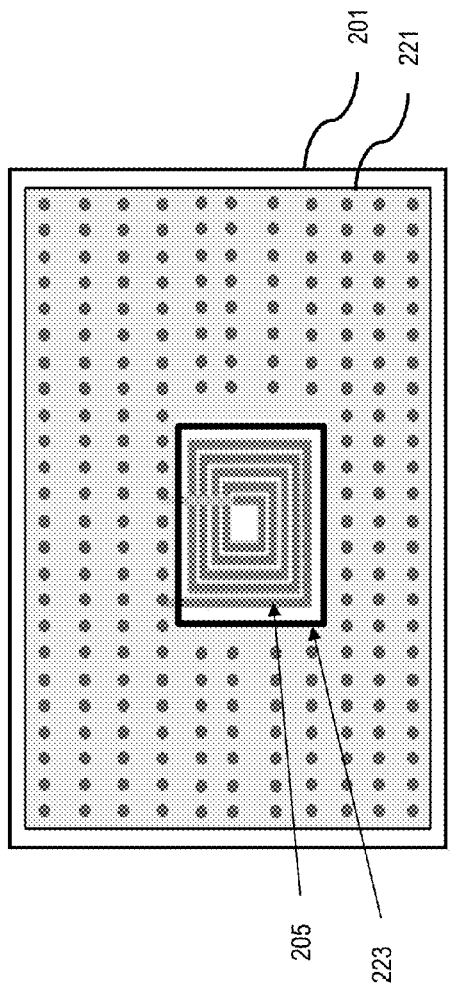
Figure 2H:
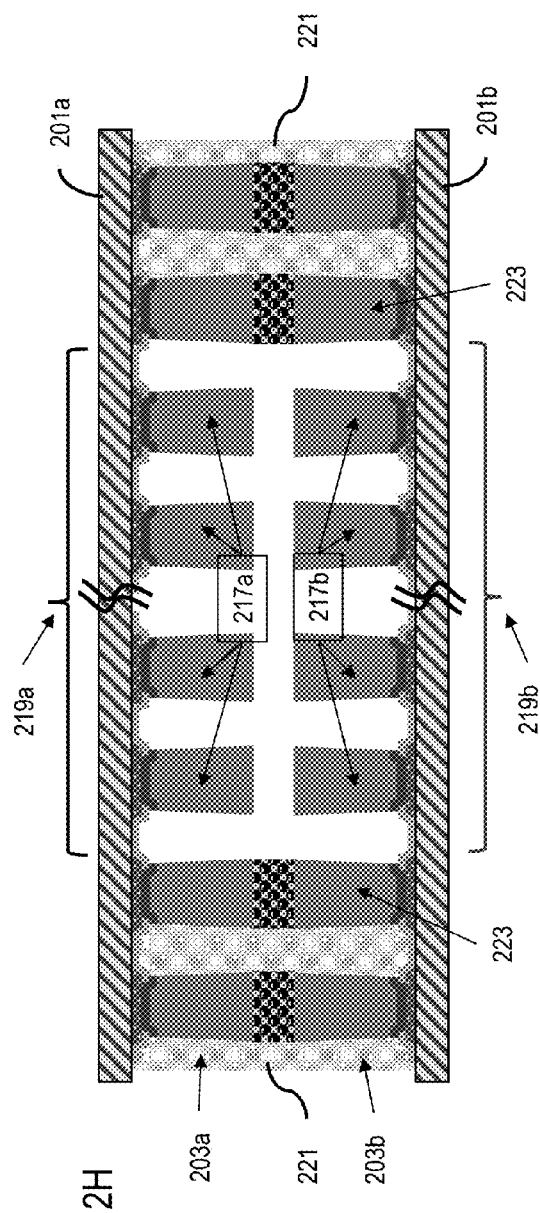

However, as there may be instances where air instead of an under-fill material is more desirable (e.g., due to improved electrical characteristics), it is possible to create a walled structure surrounding the inductor elements to prevent the under-fill material from reaching the inductor elements. As illustrated in FIG. 2G, coil 205 of an inductor on a substrate 201 may be rendered isolated from an under-fill layer 221, for example, by creating a wall/barrier structure 223 on an outermost perimeter of the coil 205. FIG. 2H illustrates a cross sectional view of bonded substrates 201a and 201b where the barrier structure 223 prevents flow of the under-fill material 221 into inductor areas 219a and 219b where the coil line segments 217a and 217b (e.g., of coils 205a and 205b) are formed. A barrier structure 223 may be in a same form (e.g., rectangular) of a perimeter (e.g., rectangular) of a coil that is to be isolated from the under-fill material. The barrier structure 223 may be formed on the surface of the substrate 201a opposing the surface of the substrate 201b, and once the two substrates are bonded, the barrier structure 223 would block any under-fill material from flowing into the inductor areas 219a and 219b. Alternatively, the barrier structure 223 may be split into two segments (e.g., height of a rectangular barrier split into two), and created on the two substrates 201a and 201b. Once the two substrates are bonded, the two segments would form a completed barrier structure. A barrier structure 223 may be formed by creating a continuous structure, for example, a rectangular structure formed by connected metal line segments, or a barrier structure 223 may be formed by fusing adjacent interconnecting elements surrounding the perimeter of the coils 205a and 205b on the surface of the substrates, respectively, 201a and 201b.

It is noted that a thickness of the bonding caps 215a, 215b, and/or bonding pads 213 may be adjusted to vary the spacing between the set of coupled inductor coils 205a and 205b. Also, a width of the coil line segments 217a and 217b may be adjusted in order to meet the performance criteria (e.g., inductance) or electrical characteristics (e.g., series resistance) of a set of coupled inductor coils.

FIGS. 3A through 3H illustrate a process flow for creating interconnecting elements with solder caps as well as an inductor structure on a surface of a substrate, in accordance with exemplary embodiments.

Figure 3A:
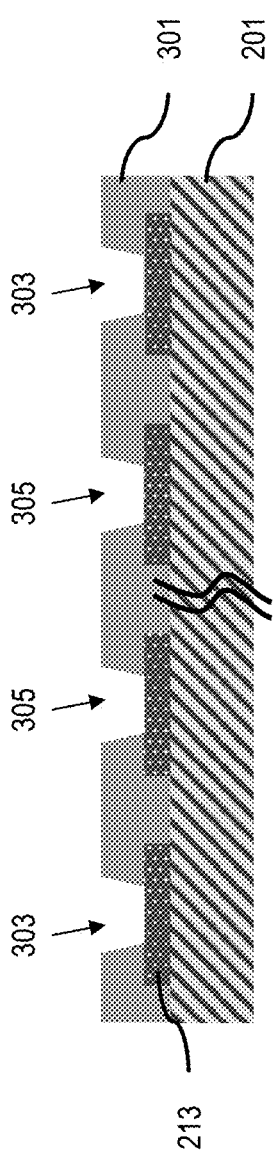
FIGS. 3A through 3H illustrate a process flow for creating interconnecting elements with solder caps as well as an inductor structure on a surface of a substrate, in accordance with an exemplary embodiment.
Figure 3B:
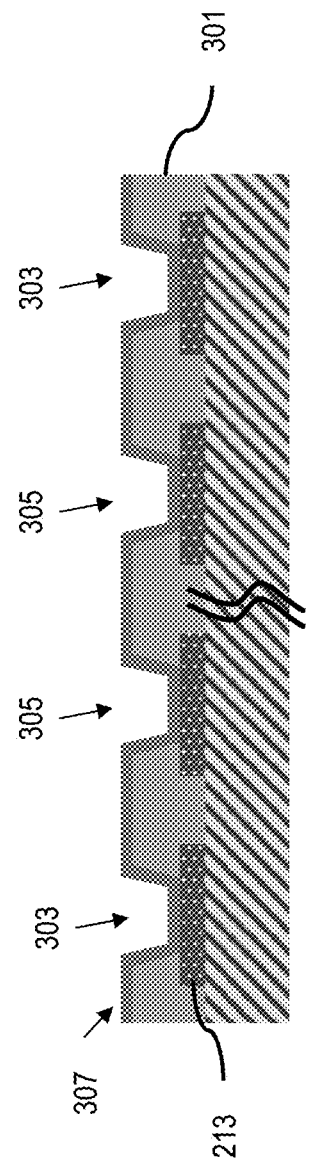
Figure 3C:
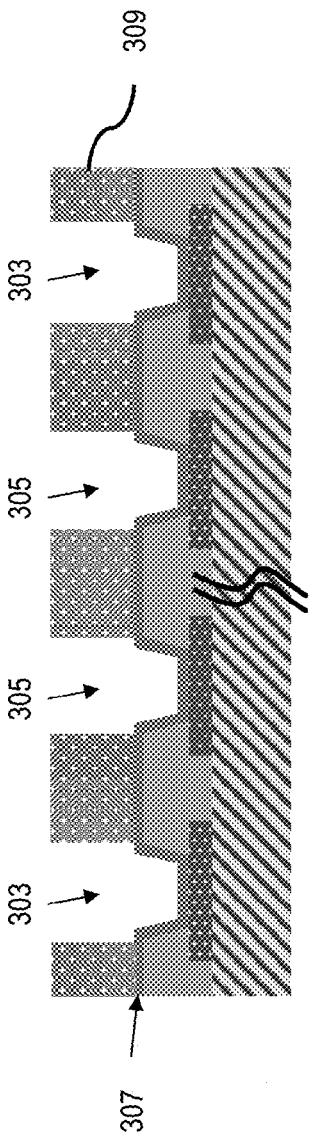
Figure 3D:
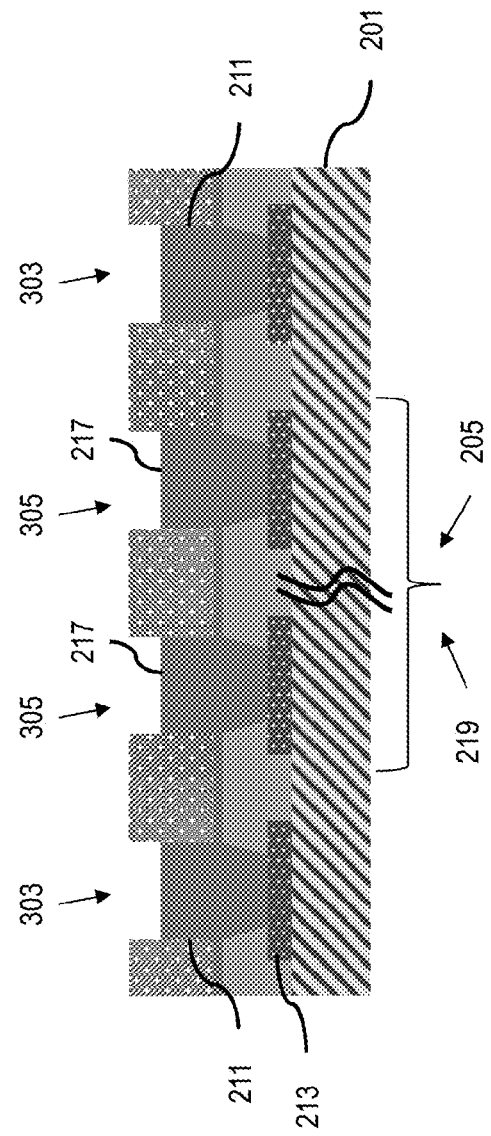

FIG. 3A illustrates bonding pads 213 on an upper surface of a substrate layer 201. Further, a protective layer 301 (e.g., for die passivation) is formed on exposed sections of the upper surface of the substrate layer 201 and on upper surfaces of the bonding pads 213. Additionally, cavities 303 and cavities 305 (the number of which depends on the number of segments or rings of the inductor coil) may be formed by a lithography process, wherein the cavities 303 and 305 expose mid-sections of upper surfaces of the bonding pads 213 through the protective layer 301. In FIG. 3B, a metal bonding layer 307 (e.g., Cu seed layer) is deposited on an upper surface of the protective layer 301, and in the cavities 303 and 305, which include the exposed upper surfaces of the bonding pads 213. FIG. 3C illustrates a first photoresist layer 309 formed (e.g., by a lithography process) on upper surfaces of horizontal sections of the metal bonding layer 307, but not in the cavities 303 and 305. In FIG. 3D, the cavities 303 are filled with a conductive material (e.g., Cu) to form metal segments/pillars 211. The cavities 305 are also filled with a conductive material (e.g., Cu) to form a plurality of connected metal line segments 217 for forming an inductor structure 205 in an inductor area 219 on the upper surface of the substrate 201. The filled cavities 305 may form connected metal segments/pillars 211 for forming an inductor structure 205 in an inductor area 219 on the upper surface of the substrate 201.

Figure 3E:
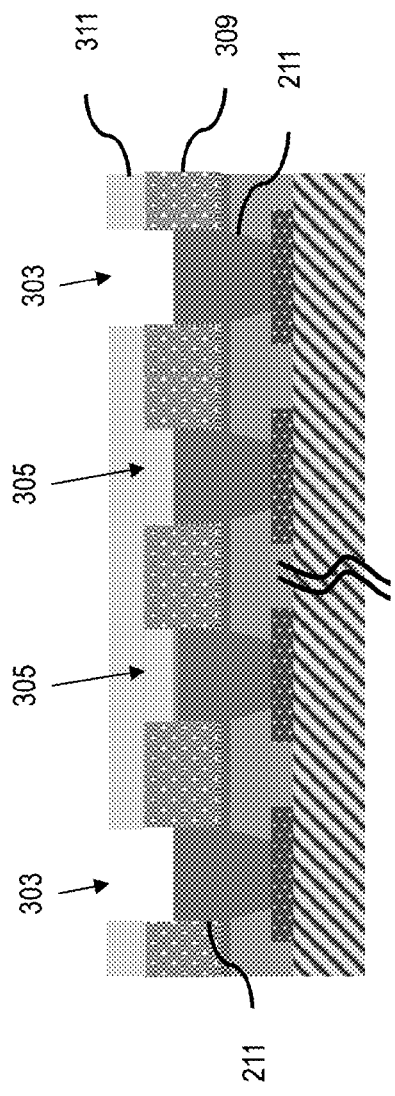
Figure 3F:
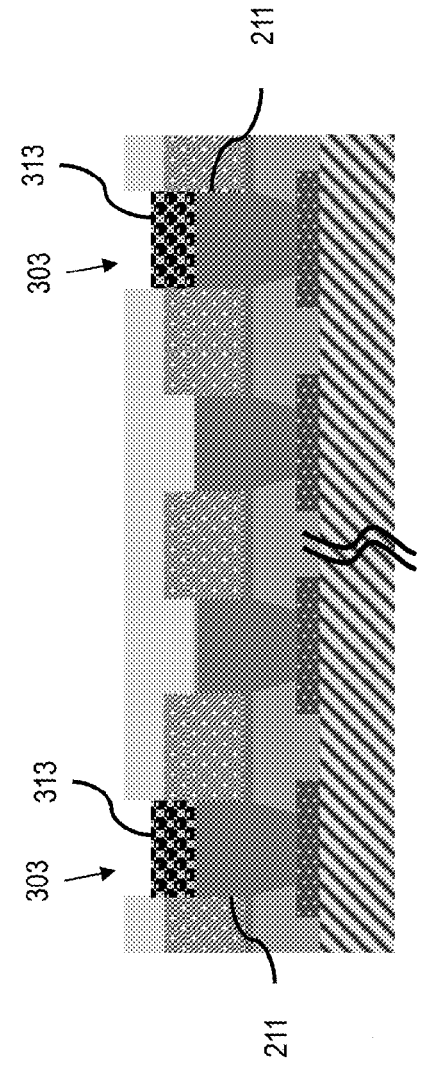
Figure 3G:
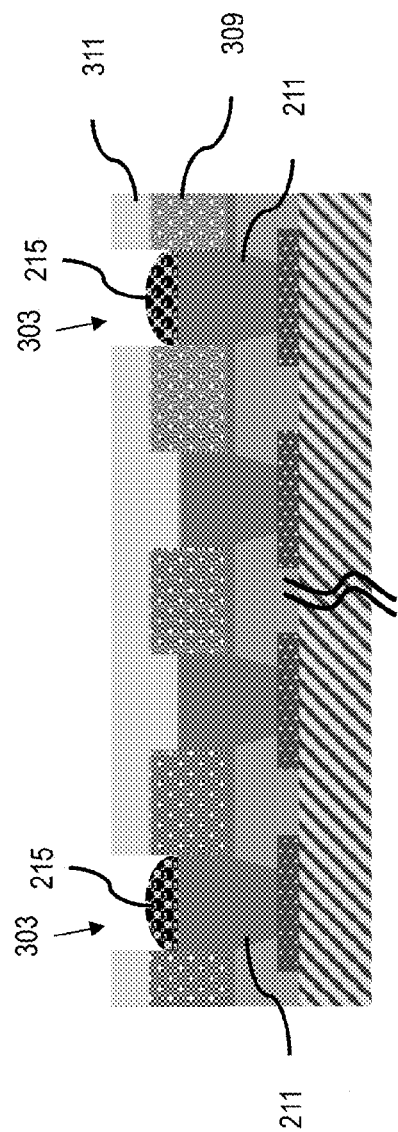
Figure 3H:
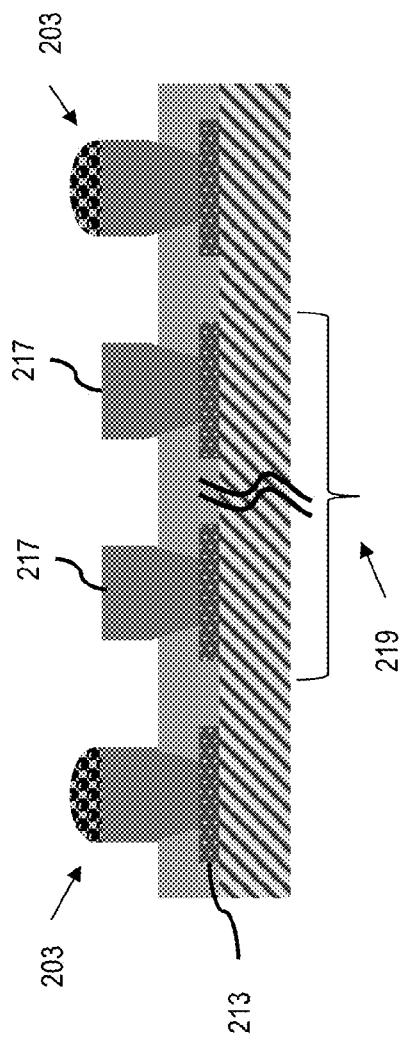

FIG. 3E illustrates a second photoresist layer 311 formed on upper surfaces of the first photoresist layer 309 and in the cavities 305, wherein upper surfaces of the metal segments 211 are exposed. In FIG. 3F, a layer of metallic bonding material 313 (e.g., solder) is deposited (e.g., by plating or printing) on the upper surfaces of the metal segments 211 in the cavities 303. After a reflow processing of the metallic bonding material 313, as illustrated in FIG. 3G, bonding caps 215 are formed as solder bumps on the upper surfaces of the metal segments 211 in cavities 303. The solder bump height may be a few micrometers and will keep the opposing inductors apart. The total height of metal segment 211 and solder cap 215 may be about 25 µm. The width and pitch, however, are not limited and can be optimized for lower inductor resistance. After removal of the second and first photoresist layer 311 and 309, respectively, interconnecting elements 203 with solder caps 215 and metal line segments 217 (in the inductor area 219) are formed, as shown in FIG. 3H.

FIGS. 4A through 4H illustrate an alternative process flow for creating interconnecting elements with solder caps as well as an inductor structure on a surface of a substrate, in accordance with another exemplary embodiment.

Figure 4A:
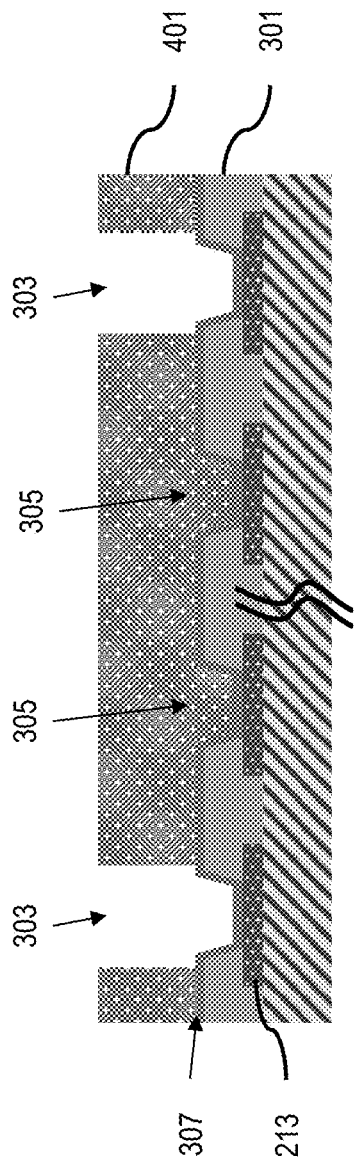
Figure 4B:
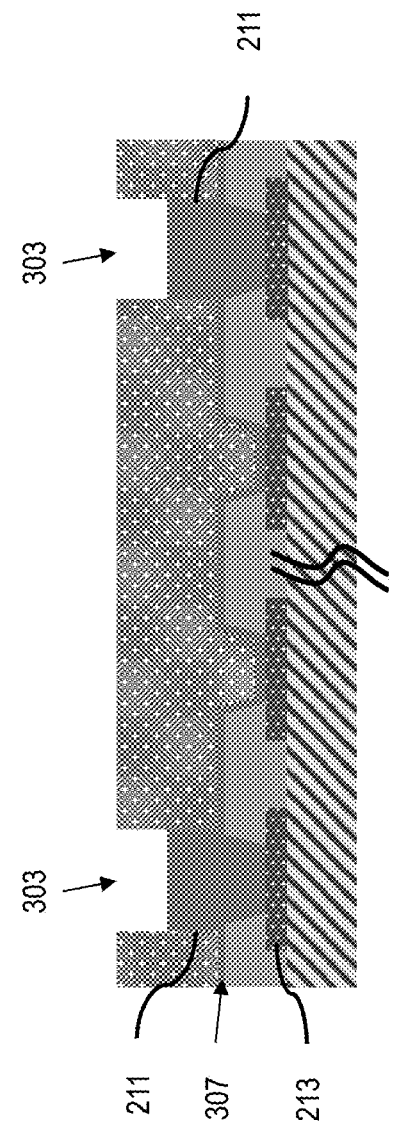

After similar processes as discussed with reference to FIGS. 3A and 3B, FIG. 4A illustrates a first photoresist layer 401 formed (e.g., by a lithography process) on upper surfaces of horizontal sections of the metal bonding layer 307 as well as in the cavities 305, but not in the cavities 303. In FIG. 4B, the cavities 303 are filled with a conductive material (e.g., Cu) to form metal segments/pillars 211, which connect to upper surfaces of the bonding pads 213 through the metal bonding layer 307 in the cavities 303.

Figure 4C:
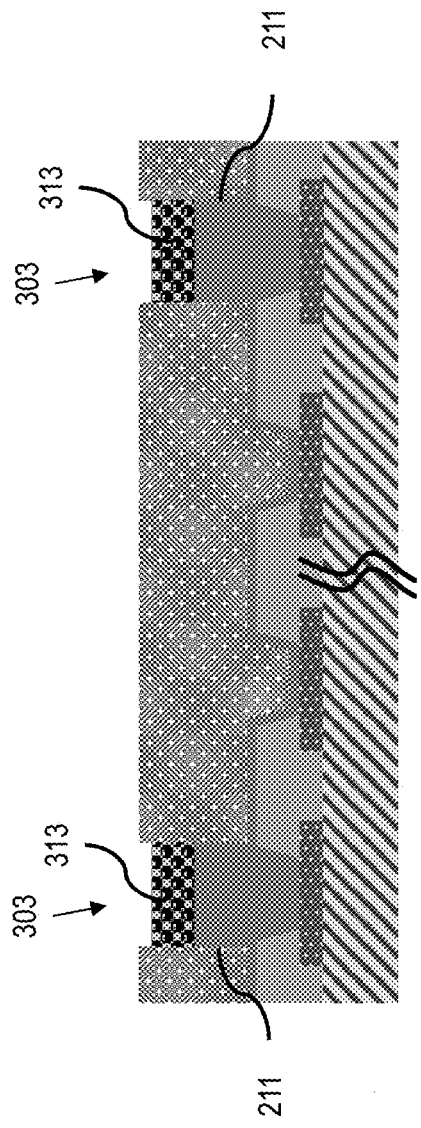
Figure 4D:
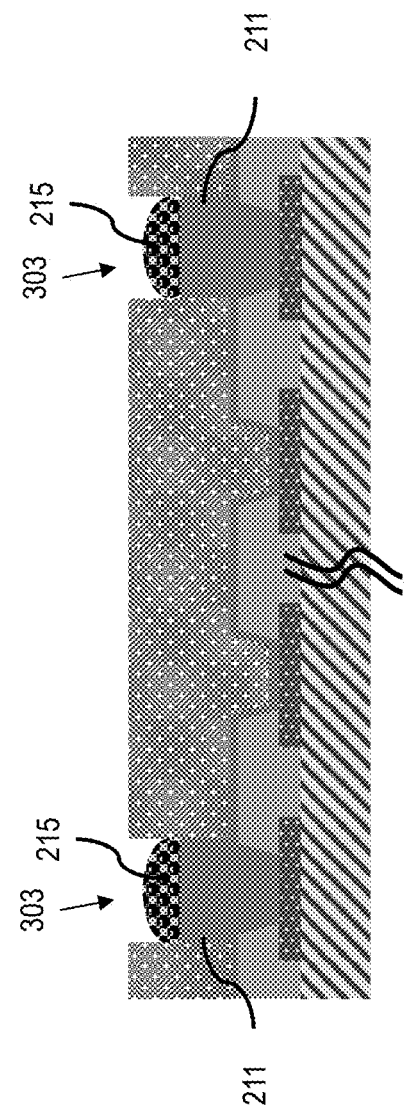

In FIG. 4C, a layer of metallic bonding material 313 (e.g., solder) is deposited (e.g., by plating or printing) on the upper surfaces of the metal segments 211 in the cavities 303. After a reflow processing of the metallic bonding material 313, as illustrated in FIG. 4D, bonding caps 215 are formed on the upper surfaces of the metal segments 211 in the cavities 303.

FIG. 4E illustrates a second photoresist layer 403 formed on upper surface of the first photoresist layer 401 and in the cavities 303 covering the upper surfaces of the bonding caps 215. In FIG. 4F, sections of the second and first photoresist layers, 403 and 401, are removed (e.g., etched), respectively, to expose the cavities 305. In FIG. 4G, the cavities 305 are filled with a conductive material (e.g., Cu), for example, to form a plurality of connected metal line segments 217 for forming an inductor structure 205 on the upper surface of the substrate 201 in an inductor area 219. Also, the filled cavities 305 may form connected metal segments/pillars 211 for forming an inductor structure 205 on the upper surface of the substrate 201 in an inductor area 219. After removal of the second and first photoresist layers 403 and 401, respectively, interconnecting elements 203 and metal line segments 217 (in the inductor area 219) are formed, as shown in FIG. 4H.

The embodiments of the present disclosure can achieve several technical effects, including forming coupled inductors in an IC device with only a small additional cost, only one additional mask, no additional plating costs, and a narrow spacing between the two inductors due to the use of solder caps. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use static-random-access memory (SRAM) cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating integrated circuit (IC) devices, comprising:
    forming a top inductor structure, in a top inductor area on a lower surface of a top substrate, the top inductor structure having first and second top terminals at its opposite ends;
    forming a bottom inductor structure, in a bottom inductor area on an upper surface of a bottom substrate, the bottom inductor structure having first and second bottom terminals at its opposite ends;
    forming top interconnecting elements on the lower surface of the top substrate around the top inductor area, wherein the top interconnecting elements are formed concurrently with the top inductor structure;
    forming bottom interconnecting elements on the upper surface of the bottom substrate around the bottom inductor area, wherein the bottom interconnecting elements are formed concurrently with the bottom inductor structure;
    forming a mask over each of the top and bottom inductor structures;
    forming solder bumps on lower and upper surfaces, respectively, of the top and bottom interconnecting elements;
    removing the mask; and
    connecting the top and bottom interconnecting elements to each other.

2. The method according to claim 1, wherein forming each of the top and bottom inductor structures comprises:
    forming a coil of conductive material, the coil having first and second terminals at its opposite ends.

3. The method according to claim 1, further comprising:
    forming the top interconnecting elements, the bottom interconnecting elements, and solder bumps and forming a mask over the solder bumps prior to forming the top and bottom inductor structures; and
    removing the mask subsequent to forming the top and bottom inductor structures.

4. The method according to claim 1, further comprising:
forming a top barrier structure, in the top inductor area at the lower surface, spaced from and surrounding a perimeter of the top inductor structure;
forming a bottom barrier structure, in the bottom inductor area at the upper surface, spaced from and surrounding a perimeter of the bottom inductor structure;
depositing a layer of non-conductive bonding material, with a same thickness as the solder bumps, on lower and upper surfaces, respectively, of the top and bottom barrier structures; and
connecting the top and bottom barrier structures.

5. The method according to claim 4, wherein the top and bottom inductor structures are separated from each other by an air gap.

6. The method according to claim 4, wherein the top inductor structures, the top inductor areas, and top barrier structures are substantially a same geometrical shape as and are vertically aligned with the bottom inductor structures, bottom inductor areas, and bottom barrier structures, respectively.

7. The method according to claim 4, further comprising:
injecting an under-fill material around the top and bottom barrier structures subsequent to connecting the top and bottom barrier structures.

8. The method according to claim 1, wherein the top and bottom inductor structures are at a same height as the top and bottom interconnecting elements.

9. A method of fabricating integrated circuit (IC) devices, comprising:
forming a top inductor structure, in a top inductor area on a lower surface of a top substrate, the top inductor structure having first and second top terminals at its opposite ends;
forming a bottom inductor structure, in a bottom inductor area on an upper surface of a bottom substrate, the bottom inductor structure having first and second bottom terminals at its opposite ends,
wherein the top and bottom inductor structures include a coil of conductive material, the coil having first and second terminals at its opposite ends;

forming top interconnecting elements on the lower surface of the top substrate around the top inductor area;
forming bottom interconnecting elements on the upper surface of the bottom substrate around the bottom inductor area;
forming solder bumps on lower and upper surfaces, respectively, of the top and bottom interconnecting elements; and
connecting the top and bottom interconnecting elements to each other,
wherein the method of fabricating IC devices further comprises:
forming a top barrier structure, in the top inductor area at the lower surface, spaced from and surrounding a perimeter of the top inductor structure;
forming a bottom barrier structure, in the bottom inductor area at the upper surface, spaced from and surrounding a perimeter of the bottom inductor structure,
wherein the top inductor structures, the top inductor areas, and top barrier structures are substantially a same geometrical shape as and are vertically aligned with the bottom inductor structures, bottom inductor areas, and bottom barrier structures, respectively, and wherein the top and bottom inductor structures are separated from each other by an air gap;
depositing a layer of non-conductive bonding material, with a same thickness as the solder bumps, on lower and upper surfaces, respectively, of the top and bottom barrier structures; and
connecting the top and bottom barrier structures.

10. The method according to claim 9, further comprising:
injecting an under-fill material around the top and bottom barrier structures subsequent to connecting the top and bottom barrier structures.

11. The method according to claim 9, wherein the top and bottom inductor structures are at a same height as the top and bottom interconnecting elements.

* * * * *